United States Patent
Tai et al.

(10) Patent No.: US 6,898,539 B2
(45) Date of Patent: May 24, 2005

(54) METHOD FOR ANALYZING FINAL TEST PARAMETERS

(75) Inventors: Hung-En Tai, Taipei Hsien (TW); Chien-Chung Chen, Hsin-Chu (TW)

(73) Assignee: Powerchip Semiconductor Corp., Hsin-Chu (TW)

(*) Notice: Subject to any disclaimer, the term of this patent is extended or adjusted under 35 U.S.C. 154(b) by 0 days.

(21) Appl. No.: 10/604,979

(22) Filed: Aug. 29, 2003

(65) Prior Publication Data

US 2004/0138856 A1 Jul. 15, 2004

(30) Foreign Application Priority Data

Dec. 31, 2002 (TW) .................................... 91138168 A

(51) Int. Cl.$^7$ .............................................. G06F 19/00
(52) U.S. Cl. ...................................................... 702/81
(58) Field of Search ........................ 702/33–35, 81–84, 702/181–185; 438/14, 15; 700/109, 110, 121

(56) References Cited

U.S. PATENT DOCUMENTS

| 6,055,463 A | * | 4/2000 | Cheong et al. | ............. 700/223 |
| 2004/0124830 A1 | * | 7/2004 | Tai et al. | ................. 324/158.1 |

* cited by examiner

Primary Examiner—Michael Nghiem
(74) Attorney, Agent, or Firm—Winston Hsu

(57) ABSTRACT

A method for analyzing final test parameters includes the following steps: To retrieve the final test parameters of each product lots by searching a database. To compare the final test parameters to select a representative final test parameter and a representative final test item. To determine if the representative final test item is correlated to a packaging process step. To classify the plurality of product lots into at least a first qualified group and a first failed group according to the representative final test item if there is correlation. To search for the equipment through which the first qualified group or the first failed group had passed in the packaging process step. To determine the equipment having a probability of having processed the first failed group being greater than a probability of having processed the first qualified group.

16 Claims, 4 Drawing Sheets

METHOD FOR ANALYZING FINAL TEST PARAMETERS

BACKGROUND OF INVENTION

1. Field of the Invention

The present invention relates to a method for analyzing semiconductor process parameters, and more particularly, to a method for analyzing final test parameters.

2. Description of the Prior Art

In the arena of semiconductor manufacturing, many processes, such as photolithography processes, etching processes, ion implantation processes, etc., are required to complete the fabrication of a semiconductor product. A large amount of equipment and complicated procedures are required in a semiconductor manufacturing process. Therefore, engineers in the field spend a great deal of time ensuring the proper operation of equipment, sustaining or improving production yield rates, detecting and verifying problems, and periodically maintaining facilities for production and the like so as to ensure that overall operations are in good order, and to ensure the production of satisfactory products.

In order to identify semiconductor processing problems, data such as process parameter data, in-line quality control (in-line QC) data, defect inspection data, sample test data, wafer test data, and final test data, are analyzed. The final test data contains testing values acquired by performing testing of semiconductor devices after dicing and packaging procedures.

Please refer to FIG. 1. FIG. 1 is a flow chart of a prior art method for analyzing final test parameters. As shown in FIG. 1, step 101 is first executed by an engineer to perform various final test items upon each semiconductor device after the packaging process. For example, the testing of certain electrical characteristics is performed on the pins of the semiconductor devices.

Step 102 is then executed. In step 102, the results acquired from various final test items performed upon each semiconductor device is analyzed by an engineer to detect product having abnormal final test results.

In step 103, the possibly faulty process step or the possibly faulty testing step is determined by way of personal experience acquired by an engineer, and is based upon the final test results of the abnormal products selected from step 102. A possibly faulty process step may be, for example, a packaging process, and the possibly faulty testing step, for example, may be an in-line quality control step, a sample test, etc.

Finally, step 104 is executed. In step 104, the engineer identifies the malfunctioning equipment by checking the equipment utilized in the process step determined in step 103, or reset various preset values of the testing step determined in step 103. For example, the engineer may first determine that one of the pins in the semiconductor device is out of order, search for the process step in which the packaging process is performed, and find out which equipment is malfunctioning, such as the wire bonding equipment, the molding equipment, etc. In addition, if the engineer determines that the problem of the semiconductor device is correlated to a previous manufacturing processes, then it can be assumed that an in-line testing step, executed previously, has also probably gone wrong, to cause the problematic products not able to be checked out. Under such circumstances, the engineer will have to revise various predefined specs of the in-line testing step to ensure that the problem is not repeated. However, since the analysis results (step 103) and the revised numerical values (step 104) are determined according to an engineer's personal experience, the accuracy and confidence level of the final analysis results are open to question. Furthermore, human resources in semiconductor manufacturing plants change frequently. It is not easy to transfer an engineer's personal experience. The capacity of each engineer is a limited resource, meaning that the engineer is unable to look after the operational status of all the equipment in the plant. When the testing results from semiconductor products indicate abnormalities, it is often difficult for engineers, lacking in experience, to rapidly and correctly determine which process point is responsible for the problem. As a result, a lot of time is wasted to undertake related research, and even worse, incorrect decisions are made. This will not only reduce process efficiency, but also increases costs. Furthermore, the in-line production status cannot be improved in time to increase the yield rate.

It is therefore very important to provide an analytical-method to rapidly and correctly determine which point in a semiconductor manufacturing process has caused a problem to occur, and to correct the predefined specs when the final test data of the semiconductor products indicates abnormalities.

SUMMARY OF THE INVENTION

It is an objective of the claimed invention to provide a method for analyzing final test parameters to rapidly and correctly determine which point causes problems to occur-when final test data of semiconductor products indicates abnormalities.

It is another objective of the claimed invention to provide a method for analyzing final test parameters to revise the control spec of in-line quality control or the sample test according to the testing results acquired from the final test and the in-line quality control or the sample test.

It is a feature of the claimed invention to analyze various testing data and equipment data of inferior product lots by utilizing a statistical analysis means and a commonality analysis means, using superior product lots as a reference group.

The claimed invention method for analyzing final test parameters is utilized for analyzing a plurality of product lots, each of the product lots having a lot number, the product lots fabricated by way of plurality of equipment. Each wafer in each product lot is tested according to a plurality of final test items to generate a plurality of final test parameters. The final test items, the final test parameters, and a packaging process step correlated to the final test items are stored in a database. The final test parameters of the plurality of product lots are retrieved by searching the database. The final test parameters are compared to select a representative final test parameter and a corresponding representative final test item. It is then determined if the representative final test item is correlated to the packaging process step. The representative final test parameters of the plurality of product lots are compared with a predefined spec if the representative final test item is correlated to the packaging process step to classify the product lot having the representative final test parameter greater than the predefined spec into a final failed group, and the product lot having the representative final test parameter smaller than the predefined spec into a first qualified group. The equipment through which the product lots in the first qualified group has passed in the packaging process step is searched.

The equipment through which the product lots in the first failed group had passed in the packaging process step is also searched. The equipment having a probability of having processed the first failed group being greater than a probability of having processed the first qualified group is then determined.

In addition, each wafer in each product lot is tested according to an in-line quality control item and a sample test item correlated to the final test item to generate an in-line quality control parameter and a sample test parameter. The in-line quality control item, the sample test item, the in-line quality control parameter, and the sample test parameter are stored in the database. According to the present invention method for analyzing final test parameters, the control spec of the in-line quality control or the sample test is revised by statistically analyzing the testing results acquired from the final test and the in-line quality control or the sample test.

It is an advantage of the claimed invention to utilize a plurality of superior product lots as a reference group, and utilize statistical analysis means and commonality analysis means to analyze various testing data and equipment data of the inferior product lots. Therefore, a point causing problems to occur is rapidly and correctly determined when the final test data of semiconductor products indicates abnormalities so that the possibly faulty process step is determined correctly. As a result, malfunctioning equipment is identified. In addition, the control spec of the in-line quality control or the sample test is revised according to analysis results. By effectively reducing mistakes due to a lack of personal experience on the part of a process engineer, processing efficiency is improved, costs are decreased, and the overall in-line production status is improved in time to increase yield rates.

These and other objectives of the present invention will no doubt become obvious to those of ordinary skill in the art after reading the following detailed description of the preferred embodiment, which is illustrated in the various figures and drawings.

DETAILED DESCRIPTION

In the following, relevant drawings are referred to illustrate a method for analyzing final test parameters according to a preferred embodiment of the present invention. Identical components are described with the same reference numbers.

Figure 1:
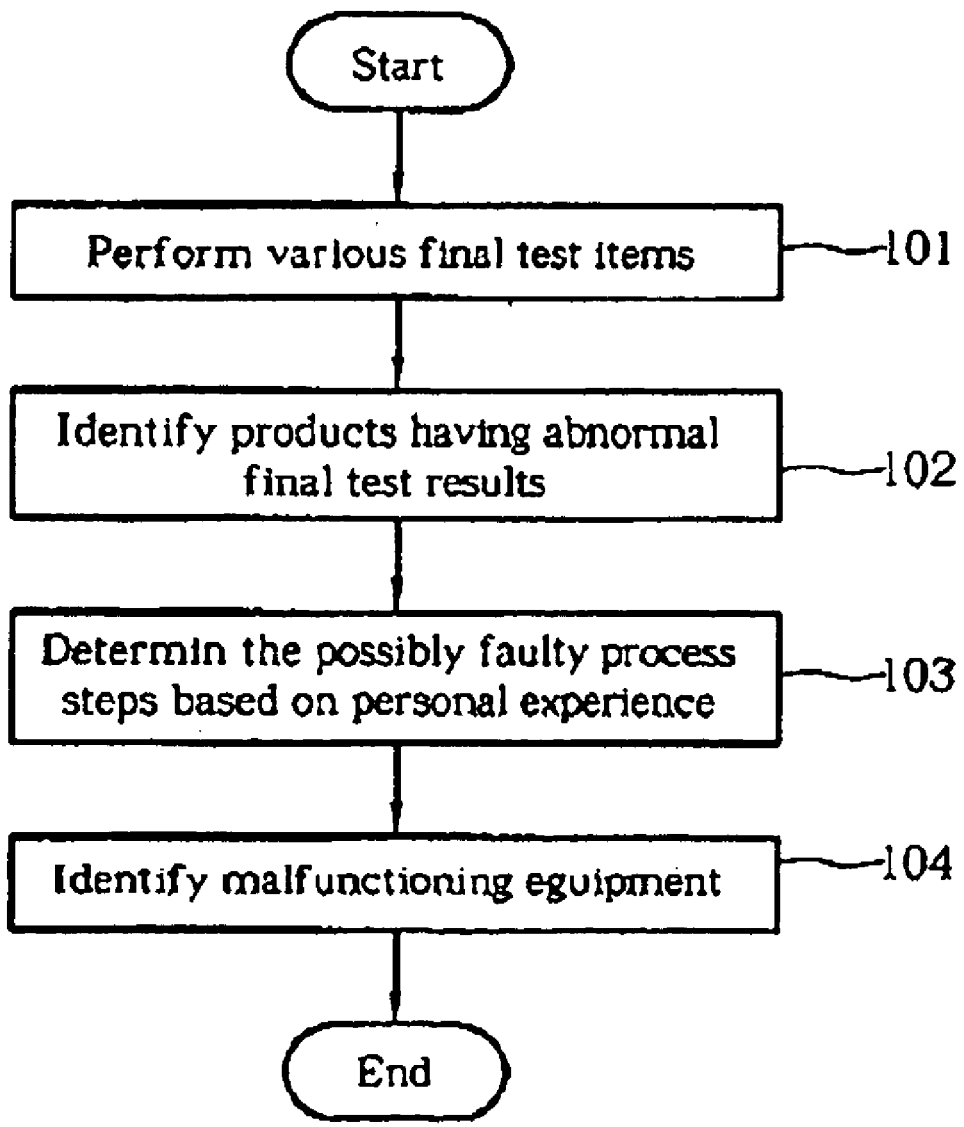
FIG. 1 is a flow chart of a prior art method for analyzing final test parameters.
Figure 2:
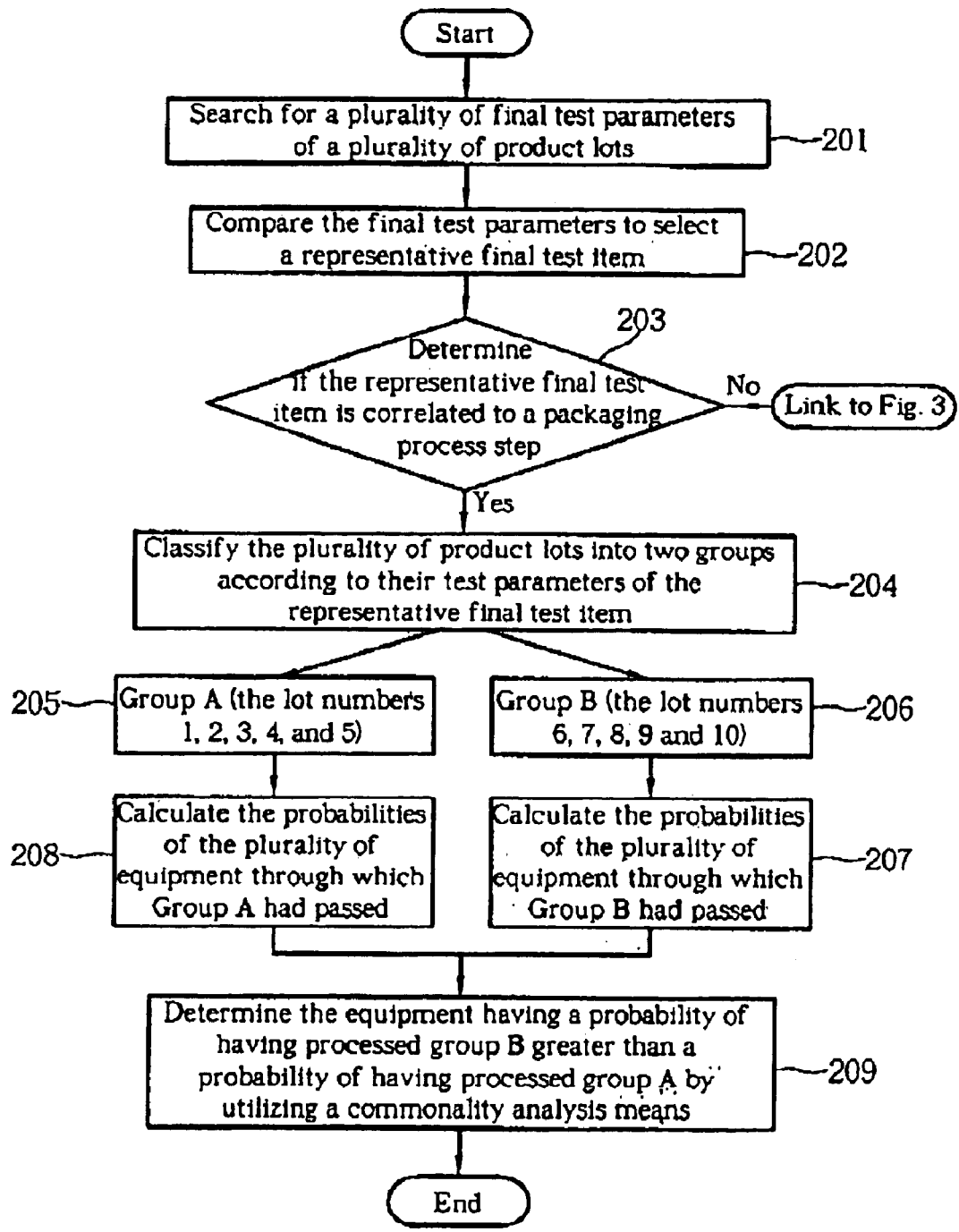
FIG. 2 is a flow chart of a method for analyzing final test parameters according to a preferred embodiment of the present invention.

Please refer to FIG. 2. FIG. 2 is a flow chart of a method for analyzing final test parameters according to the preferred embodiment of the present invention. The objective of the method according to the preferred embodiment of the present invention is to analyze and identify malfunctioning packaging equipment.

Figure 3:
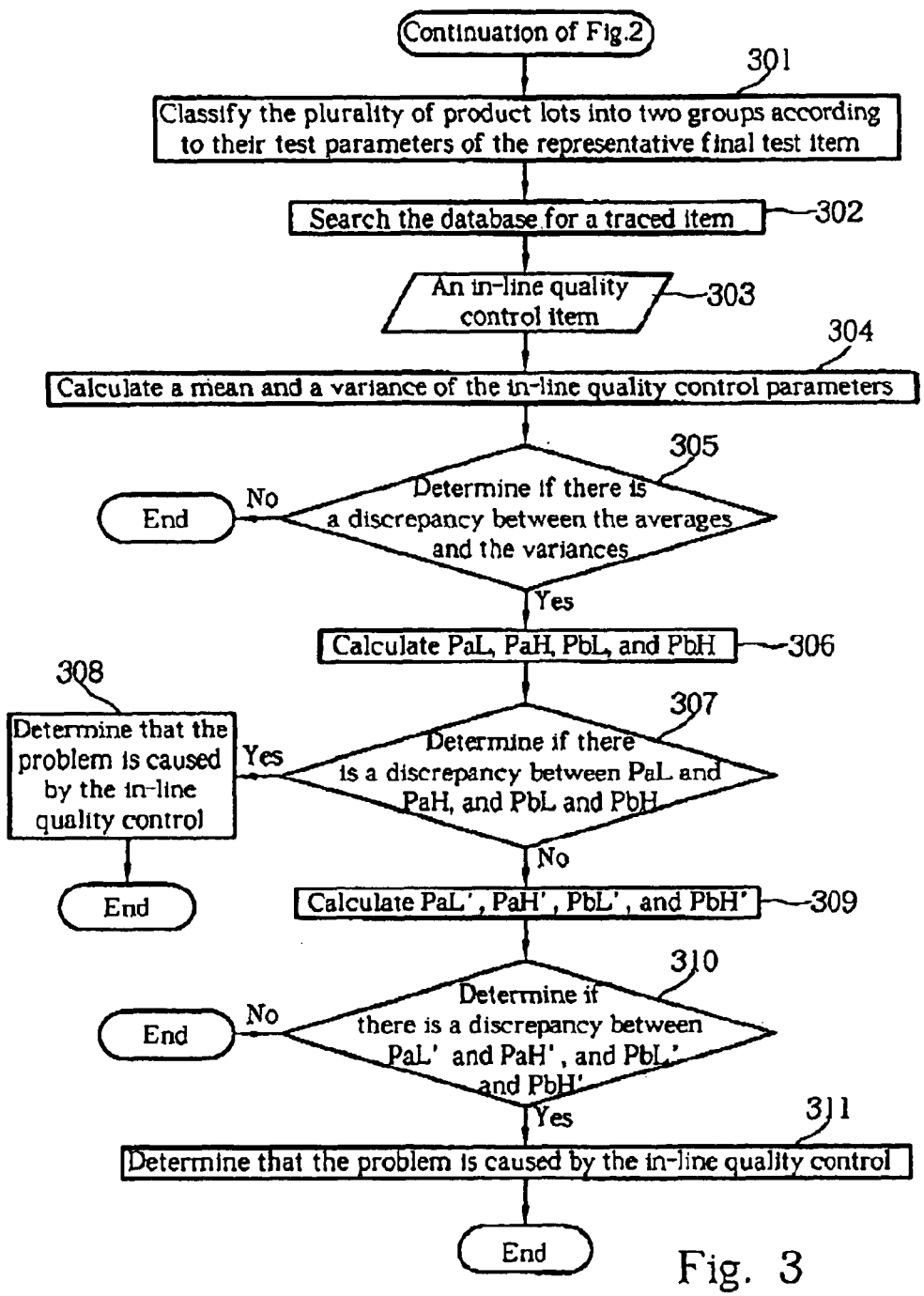
FIG. 3 is an example table showing final test parameters acquired from the method for analyzing final test parameters depicted in FIG. 2.

As shown in equipment FIG. 2, step 201 is first executed to search for a plurality of final test parameters from a plurality of product lots according to the method for analyzing the final test parameters in the preferred embodiment of the present invention. Then step 202 is executed to compare the final test parameters to select a representative final test parameter and a corresponding representative final test item. Please refer to FIG. 3. FIG. 3 is an example table showing final test parameters acquired from the method for analyzing final test parameters indicated in FIG. 2. For example, if there are n products lots, all of the products lots are analyzed according to the final test items, comprising item A, item B, and item C, and all of the final test parameters are shown in FIG. 3. Each of the percentage values shown in FIG. 3 represents the failure rate of each lot number in each final test item. In this step item A, which is the final test item having the highest average failure rate, is selected as the representative final test item. In other words, the representative final test item is a killed final test item, which is the final test item having the highest average failure rate when a plurality of lots of products are tested.

In the preferred embodiment of the present invention, each product lot, comprising twenty-five wafers, has a lot number. Each product lot is fabricated by way of a plurality of equipment for a plurality of process steps, and is tested according to a plurality of final test items to generate a plurality of final test parameters.

Step 203 is thereafter executed to determine if the representative final test item is correlated to a packaging process step. Generally speaking, each of the final test items is correlated to some specific processing equipment. In the preferred embodiment of the present invention, this correlation is stored in a database to avoid determinations based upon personal judgment.

Figure 4:
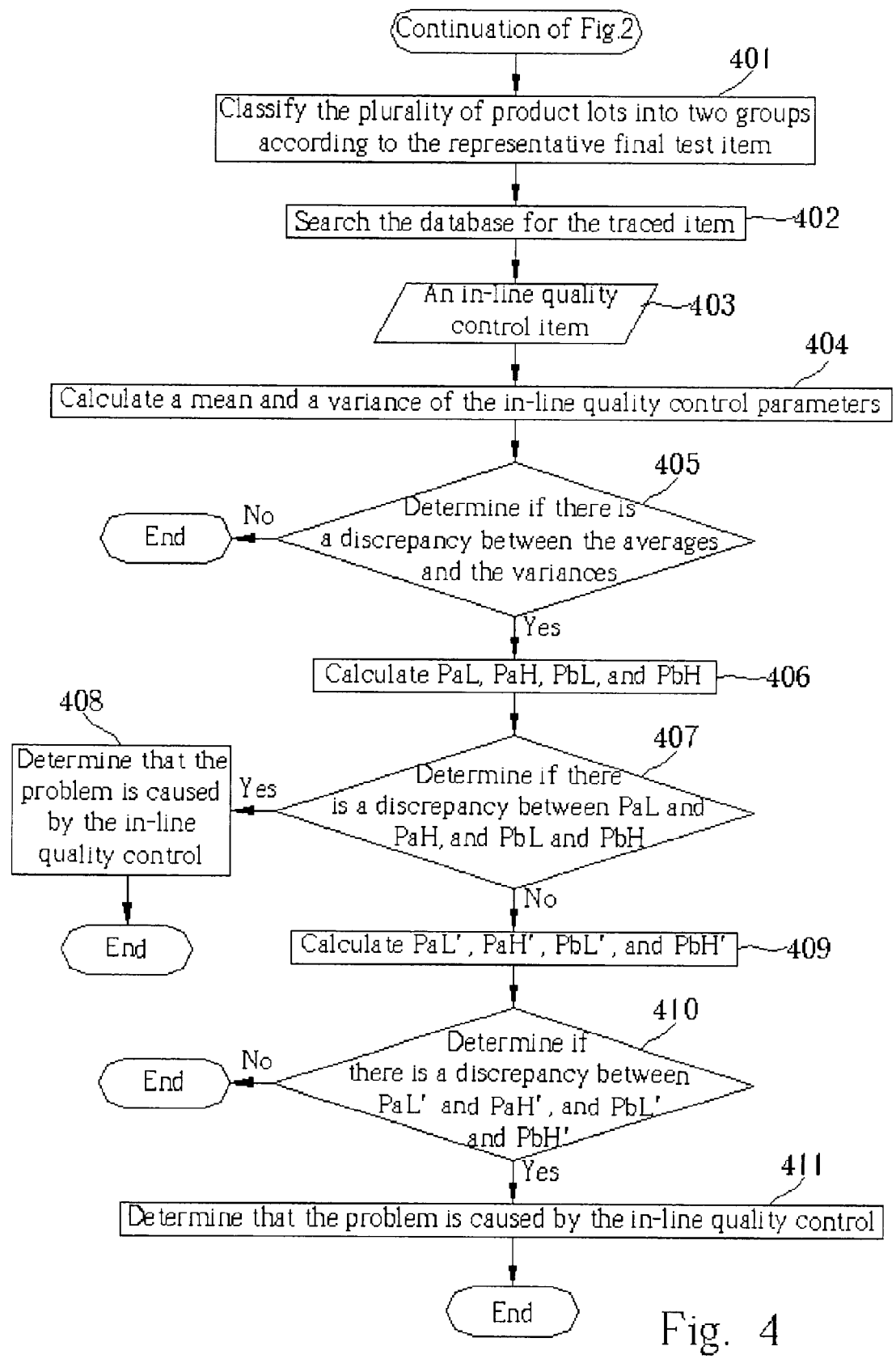
FIG. 4 is a flow chart of a method for analyzing final test parameters according to the preferred embodiment of the present invention if the representative final test time is not correlated to the packaging process steps.

If the representative final test time is determined to not correlate with the packaging process step in step 203, the present invention method will execute analysis for other correlating processes, such as an in-line quality control, a sample test, etc. (as shown in FIG. 4). If the representative final test item is determined to correlate with the packaging process step in step 203, step 204 is executed to classify the plurality of product lots into at least a first qualified group and a first failed group according to the representative final test item. For example, the parameter of each product lot in item A (the failure rate) is compared with a predefined spec of item A (for example: 20%) in this step to determine if the parameter of each product lot in item A is greater than the predefined spec item A. If it is not, the product lot is classed into group A (the first qualified group), for example, the lot numbers 1, 2, 3, 4, and 5 (as shown in step 205). If it is, the product lot is classed into group B (the first failed group), for example, the lot numbers 6, 7, 8, 9 and 10 (as shown in step 206).

Next, step 207 is executed to calculate the probabilities of the plurality of equipment through which Group B had passed in the packaging process step. Generally speaking, a plurality of equipment is utilized in one packaging process step, such as E1, E2, E3, etc. In addition, step 208 is executed to calculate the probabilities of the plurality of equipment through which Group A passed in the packaging process step. Finally, Step 209 is executed to determine the equipment that has a probability of having processed group B that is greater than a probability of having processed group A, by utilizing a commonality analysis means. The equipment having a probability of having processed group B that is greater than a probability of having processed group A, as determined in Step 209, is the possibly faulty packaging equipment analyzed according to the method for analyzing final test parameters in the preferred embodiment of the present invention.

Please refer to FIG. 4. FIG. 4 is a flow chart of a method for analyzing final test parameters if the representative final test item is determined to not correlate with the packaging process step according to the preferred embodiment of the present invention. As shown in FIG. 4, step 401 is executed immediately after the representative final test item is determined to not correlate with the packaging process step in step 203. In step 401, the plurality of product lots are classified into at least a second qualified group and a second failed group according to the representative final test item. In the preferred embodiment of the present invention, the parameter of each product lot in item A (the failure rate) is compared with the predefined spec of item A (for example: 20%) in this step to determine if the parameter of each product lot in item A is greater than the predefined spec of item A. If it is not, the product lot is classed into the second qualified group. If it is, the product lot is classed into the second failed group.

Step 402 is then executed to search the second qualified group and the second failed group within the database for the in-line quality control item or the sample test item correlated to item A (the representative final test item), and the corresponding in-line quality control parameter or the corresponding sample test parameter, respectively. In the preferred embodiment of the president invention, an in-line quality control item correlated to item A is selected in this step (as shown in step 403).

Next, step 404 and step 405 are executed to determine if there is a discrepancy between the search results of the second failed group and the second qualified group by way of a statistical means. According to the preferred embodiment of the present invention, the parameters acquired from the in-line quality control determined in step 403 are first analyzed in step 404 to calculate a mean and a variance of the in-line quality control parameters. Step 405 is then executed to determine if there is a discrepancy between the average and the variance of the in-line quality control parameters of the second failed group and the average and the variance of the in-line quality control parameters of the second qualified group, respectively. If there is no discrepancy according to the results determined in step 405, the overly high failure rate in item A is not caused by the in-line quality control item selected in step 402 (as shown in step 403), and so the analysis is stopped. If there is a discrepancy according to the results determined in step 405, step 406 is executed because the overly high failure rate in item A is probably correlated to the in-line quality control item selected in step 402 (as shown in step 403).

In step 406 to step 411, the causes for the problematic in-line quality control item are analyzed so that a method for revising the control spec of the in-line quality control item is provided.

In step 406, the quantities of out of spec portions in the second failed group and the second qualified group are calculated by way of a statistical means according to a predefined spec of the in-line quality control item selected in step 402 (as shown in step 403). At the same time, a ratio of a number of product lots in the out of spec portion in the second failed group to a total number of product lots in the second failed group, and a ratio of a number of product lots in the out of spec portion in the second qualified group to the total number of product lots in the second qualified group are also calculated. In the preferred embodiment of the present invention, the pre-defined spec of the in-line quality control item, comprising a predefined up spec limit and a predefined low spec limit, provides a specific range. Therefore, a ratio of a number of product lots in the second failed group exceeding the predefined up spec limit to a total number of product lots in the second failed group (PaL), and a ratio of a number of product lots in the second qualified group exceeding the predefined up spec limit to a total number of product lots in the second qualified group (PaH) are calculated in this step. In addition, a ratio of a number of product lots in the second failed group being lower than the predefined low spec limit to a total number of product lots in the second failed group (PbL), and a ratio of a number of product lots in the second qualified group being lower than the predefined low spec limit to a total number of product lots in the second qualified group (PbH) are also calculated.

Step 407 is thereafter executed to determine if there is a discrepancy between portions in the second failed group exceeding the predefined up spec limit and lower than the predefined low spec limit and portions in the second qualified group exceeding the predefined up spec limit and lower than the predefined low spec limit, by comparing PaL with PaH, and PbL with PbH respectively. If results determined in step 407 indicate that there is a discrepancy, step 408 is executed to determine if the overly high parameters acquired from the representative final test (the parameters acquired from the killed final test item) are caused by deviation of testing results acquired from the in-line quality control item searched in step 402 (as shown in step 403). According to the preferred embodiment of the present invention, a CDF plot may be utilized to output the testing results acquired from the in-line quality control item searched in step 402 (as shown in step 403) in step 408. Engineers are thus allowed to calibrate and revise the spec data of the in-line quality control according to the CDF plot.

If results determined by step 407 indicate that there is no discrepancy, step 409 is executed to analyze the quantities of out-of-narrowed spec portions in the second failed group and the second qualified group by a statistical means according to a narrowed spec. At the same time, a ratio of a number of product lots in the out-of-narrowed spec portion in the second failed group to a total number of product lots in the second failed group and a ratio of a number of product lots in the out-of-narrowed spec portion in the second qualified group to a total number of product lots in the second qualified group are also calculated. In the preferred embodiment of the present invention, the narrowed spec of the in-line quality control item, comprising an up narrowed spec limit and a low narrowed spec limit, provides a specific range. It is worth noting that the range of the predefined spec is usually six standard deviations for the in-line quality control process, the up narrowed spec limit is one standard deviation smaller than the predefined up spec limit, and the low narrowed spec limit is one standard deviation greater than the pre-defined low spec limit. As a result, the range of the narrowed spec is usually four standard deviations wide.

A ratio of a number of product lots in the second failed group exceeding the upnarrowed spec limit to a total number of product lots in the second failed group (PaL), and a ratio of a number of product lots in the second qualified group exceeding the up narrowed spec limit to a total number of lots of products in the second qualified group (PaH) are therefore calculated in step 409. In addition, a ratio of a number of product lots in the second failed group being less than the low narrowed spec limit to a total number of product lots in the second failed group (PbL), and a ratio of a number of product lots in the second qualified group being lower than the low narrowed spec limit to a total number of product lots in the second qualified group (PbH) are also calculated.

Step 410 is then executed to determine if there is a discrepancy between portions in the second failed group exceeding the up narrowed spec limit and being lower than the low narrowed spec limit and portions in the second qualified group exceeding the up narrowed spec limit and being lower than the low narrowed spec limit, by comparing PaL" with PaH", and PbL" with PbH" respectively. If the results determined in step 410 indicate that there is no discrepancy, the analysis is stopped because the overly high failure rate in item A is not caused by the in-line quality control item selected in step 402 (as shown in step 403). If the results determined in step 410 indicate that there is discrepancy, step 411 is executed to determine if the overly high parameters acquired from the representative final test (the parameters acquired from the killed final test item) are caused by deviation of testing results acquired from the in-line quality control item searched in step 402 (as shown in step 403). According to the preferred embodiment of the present invention, a CDF plot may be utilized to output the testing results acquired from the in-line quality control item searched in step 402 (as shown in step 403) in step 411. Engineers are thus allowed to calibrate and revise the spec data of the in-line quality control according to the CDF plot.

Furthermore, the test item searched in step 402 may be a sample test item according to another preferred embodiment of the present invention. Under the circumstances, the sample test item is analyzed and results of the sample test are compared (not shown) in step 403 to 411. As a result, engineers are able to calibrate and revise the spec data of the sample test according to analysis results.

In summary, the present invention method for analyzing final test parameters utilizes a plurality of superior product lots as a reference group, and utilizes commonality analysis means to determine the possibly faulty packaging equipment by comparing data, or utilizes statistical analysis means to analyze the in-line quality control data or the sample test data of the inferior product lots. Therefore, the point causing the problem to occur is rapidly and correctly determined when the final test data of semiconductor products indicate abnormalities so that the possibly faulty process step is determined correctly. As a result, malfunctioning equipment is identified. In addition, the control spec of the in-line quality control or the sample test is revised according to analysis results. By effectively reducing error due to a lack of professional experience, processing efficiency is improved, costs are decreased, and the in-line production status is improved in time to increase yield rates.

Those skilled in the art will readily observe that numerous modifications and alterations of the method may be made while retaining the teachings of the invention. Accordingly, the above disclosure should be construed as limited only by the metes and bounds of the appended claims.

What is claimed is:

1. A method for analyzing final test parameters, the method being utilized for analyzing a plurality of product lots, each of the plurality product lots having a lot number, the plurality of product lots being fabricated through a plurality of equipment, a wafer in each product lot being tested according to a plurality of final test items to generate a plurality of final test parameters, the final test items, the final test parameters, and a packaging process step correlated to the final test items being stored in a database, the method comprising:

retrieving the final test parameters of the plurality of product lots by searching the database;

comparing the final test parameters to select a representative final test parameter and a corresponding representative final test item;

determining if the representative final test item is correlated to the packaging process step;

classifying the plurality of product lots into at least two first groups according to their test parameters of the representative final test item if the representative final test item is determined as correlating to the packaging process step, the first product groups comprising a first qualified group and a first failed group;

searching for the equipment through which the first qualified group had passed in the packaging process step;

searching for the equipment through which the first failed group had passed in the packaging process step; and determining the equipment having a plurality of having processed the first failed group greater than probability of having processed the first qualified group.

2. The method of claim 1, wherein the representative final test item is a killed final test item.

3. The method of claim 2, wherein the killed final test item is the final test item having the highest failure rate.

4. The method of claim 2, wherein the killed final test item is the final test item having the highest average failure rate when a plurality of lots of products are tested.

5. The method of claim 1, wherein a commonality analysis means is utilized to determine the equipment having a probability of having processed the first failed group greater than a probability of having processed the first qualified group.

6. The method of claim 1, wherein each wafer in each product lot is tested according to an in-line quality control (in-line QC) item and a sample test item correlated to the final test item to generate an in-line quality control parameter and a sample test parameter, the in-line quality control item, the sample test item, the in-line quality control parameter, and the sample test parameter are stored in the database, the method further comprises:

classifying the plurality of product lots into at least two second groups according to their test parameters of the representative final test item if the representative final test item is determined as not correlating to the packaging process step, the second product groups comprising a second qualified group and a second failed group;

searching for at least one in-line quality control item or sample test item correlated to the representative final test item, and related test parameters of the second qualified group and the second failed group from the database;

statistically analyzing if there is a discrepancy between the searching results of the second failed group and the second qualified group;

stopping analyzing if there is not a discrepancy between the searching results;

statistically analyzing if there is an obvious discrepancy between an out of spec portion in the second failed group and that in the second qualified group according to a first spec if there is discrepancy between the searching results;

judging that it is deviation of testing results of the in-line quality control item or the sample test item correlated to the representative final test item causing the over high representative final test parameter if there is an obvious discrepancy according to the first spec;

statistically analyzing if there is an obvious discrepancy between an out-of-narrowed spec portion in the second failed group and that in the second qualified group according to a narrowed spec if there is not an obvious discrepancy according to the first spec;

stopping analyzing if there is not an obvious discrepancy according to the narrowed spec; and judging that it is the in-line quality control item or the sample test item correlated to the representative final test item causing the over high representative final test parameter if there is an obvious discrepancy according to the narrowed spec.

7. The method of claim 6, wherein a discrepancy between the searching results of the second failed group and that of the second qualified group is determined by determining if there is a discrepancy between a mean of the searching results of the second failed group and that of the second qualified group and if there is a discrepancy between a variance of the searching results of the second failed group and that of the second qualified group.

8. The method of claim 6, wherein the first spec comprises a first up spec limit (USL) and a first low spec limit (LSL).

9. The method of claim 8 further comprising determining if there is a discrepancy between a ratio of a number of product lots in the second failed group exceeding the first up spec limit to a total number of product lots in the second failed group, and a ratio of a number of product lots in the second qualified group exceeding the first up spec limit to a total number of product lots in the second qualified group.

10. The method of claim 8 further comprising determining if there is a discrepancy between a ratio of a number of product lots in the second failed group lower than the first low spec limit to a total number of product lots in the second failed group, and a ratio of a number of product lots in the second qualified group lower than the first low spec limit to a total number of product lots in the second qualified group.

11. The method of claim 8, wherein the narrowed spec comprises an up narrowed spec limit and a low narrowed spec limit, the up narrowed spec limit is smaller than the first up spec limit, and the low narrowed spec limit is greater than the first low spec limit.

12. The method of claim 11, wherein a range of the first spec is six times a standard deviation, the up narrowed spec limit is one standard deviation smaller than the first up spec limit, and the low narrowed spec limit is one standard deviation greater than the first low spec limit.

13. The method of claim 11, further comprising determining if there is a discrepancy between a ratio of a number of product lots in the second failed group exceeding the up narrowed spec limit to a total number of product lots in the second failed group, and a ratio of a number of product lots in the second qualified group exceeding the up narrowed spec limit to a total number of product lots in the second qualified group.

14. The method of claim 11 further comprising determining if there is a discrepancy between a ratio of a number of product lots in the second failed group lower than the low narrowed spec limit to a total number of product lots in the second failed group, and a ratio of a number of product lots in the second qualified group lower than the low narrowed spec limit to a total number of product lots in the second qualified group.

15. The method of claim 6, wherein a CDF plot is utilized to output the testing results of the in-line quality control item or the sample test item correlated to the representative final test item if there is an obvious discrepancy according to the first spec.

16. The method of claim 6, wherein a CDF plot is utilized to output the testing results of the in-line quality control item or the sample test item correlated to the representative final test item if there is an obvious discrepancy according to the narrowed spec.

* * * * *